United States Patent [19]

Thomas et al.

[11] 4,201,581
[45] May 6, 1980

[54] METHOD OF PROVIDING CLOSE CONTACT FOR CONTACT PRINTING

[75] Inventors: Harold T. Thomas, Rochester; Dennis G. Howe, Fairport; James K. Lee, Rochester, all of N.Y.

[73] Assignee: Eastman Kodak Company, Rochester, N.Y.

[21] Appl. No.: 885,922

[22] Filed: Mar. 13, 1978

[51] Int. Cl.$^2$ .................. G03C 5/06; G03C 5/04
[52] U.S. Cl. .................. 430/396; 156/74; 156/659.1; 264/241; 264/311; 355/91; 355/132; 427/240; 430/494; 430/306; 430/323; 430/444
[58] Field of Search .............. 96/27 R, 27 E, 35.1, 96/36, 44, 50 PL; 156/659, 74; 355/91, 132; 427/240; 264/8, 114, 270, 31, 241

[56] References Cited

U.S. PATENT DOCUMENTS

| | | | |
|---|---|---|---|
| 2,833,680 | 5/1958 | Kneeling | 156/74 |
| 3,537,853 | 11/1970 | Wessells et al. | 96/35.1 |
| 3,723,120 | 3/1973 | Hummel | 96/35.1 |
| 3,751,250 | 8/1973 | Moscony et al. | 96/36 |
| 3,922,086 | 11/1975 | Freericks | 156/74 X |
| 4,069,076 | 1/1978 | Fickes | 156/659 X |

OTHER PUBLICATIONS

Haininl et al., "Liquid Interface for Photoresist", IBM Tech. Disc. Bull., vol. 14, No. 9, Feb. 1972.

Primary Examiner—Edward C. Kimlin
Attorney, Agent, or Firm—Donald W. Strickland

[57] ABSTRACT

In certain types of printing applications (for example optical or magnetic contact printing) wherein it is desired to transfer imagery from a master device to a replicate device, providing and maintaining close contact between the master device and the replicate device poses certain problems. These problems become even more acute if the surfaces to be contacted are of large area. In accordance with the present invention, close contact over even large areas is obtained between a master device and a replicate device by forming a thin and uniform liquid layer between the master and replicate devices, thus producing a vacuum effect which serves to tightly press the master and replicate devices together.

18 Claims, 10 Drawing Figures

METHOD OF PROVIDING CLOSE CONTACT FOR CONTACT PRINTING

CROSS REFERENCE TO RELATED APPLICATIONS

U.S. Pat. Application Ser. No. 885,921 filed Mar. 13, 1978 in the names of Dennis G. Howe, Harold T. Thomas, and James K. Lee.

BACKGROUND OF THE INVENTION

1. Field of the Invention

The present invention relates to a method of obtaining close contact between a master device and a replicate device and, more particularly, to such a method for use in applications such as optical or magnetic contact printing.

2. Description Relative to the Prior Art

In optical contact printing, a master device containing imagery is placed in contact with a replicate device upon which it is desired to replicate the imagery. One common form of master device is a photomask comprising a piece of processed photographic film containing an image pattern. A suitable replicate device could be a piece of unexposed photographic film. Maintaining close contact between the master and the replicate devices during the contact printing process is critical if imagery containing small dots, narrow lines or other high frequency information is to be replicated. Several methods have been generally employed to maintain intimate contact between the master and replicate devices.

One such method involves the use of mechanically applied pressure. In optical contact printing, for example, an image bearing layer of a master device is placed in contact with a photosensitive layer of a replicate device to form a master-replicate sandwich. The master-replicate sandwich is placed on an exposure platen (e.g., a flat piece of translucent glass illuminated from behind by a light source) with the master device against the platen. Pressure is mechanically applied to the master-replicate sandwich by pressing down on the replicate device with a soft pad so as to apply pressure without damaging the master-replicate sandwich. The master and replicate devices are thus pressed into contact and a contact print exposure can be made through the exposure platen.

Because methods such as the one described above in which a master device and a replicate device are mechanically squeezed together are not well suited for maintaining intimate contact between the master and replicate devices, other methods of contact printing have been employed. A form of contact printing often used when close contact is critical (i.e., when printing imagery containing higher frequency information) is a form commonly referred to as vacuum contact printing. In this method, a vacuum pump is used to evacuate air from between the master and replicate devices, thus leaving a vacuum therebetween which has the effect of tightly pressing the master and replicate devices together. It has been found that vacuum contact printing works well and that intimate contact can be maintained, at least over relatively small areas. Over larger areas, however, it is difficult to satisfactorily evacuate the air from between the master and replicate devices with the result that air pockets remain which prevent intimate contact. The quality of the printed image thus tends to be somewhat uneven—of excellent quality in those areas of the replicate device where intimate contact with the master device was maintained, but of poor quality in those areas of the replicate device where pockets of trapped air resulted in a complete loss of contact.

There are applications other than optical contact printing wherein it is desired to replicate imagery from a master device to a replicate device. As one example, in magnetic contact printing a master device of high coercivity having magnetic images thereon is placed in contact with a magnetic replicate device of low coercivity such as a blank piece of magnetic recording tape. The master-replicate sandwich is subjected to a magnetic field of insufficient strength to erase the master device but of sufficient strength to record on the replicate device. Under the influence of the applied magnetic field, the magnetic imagery on the master device is replicated on the replicate device. The quality of such image replication depends upon the contact maintained between the master and replicate devices. Like optical contact printing, magnetic contact printing depends upon intimate contact for optimum results.

In the case where the magnetic materials comprise strips of magnetic recording tape, the master and replicate devices are often contacted by squeezing them together between a pair of pinch rollers or other similar mechanism. More recently, however, it has become an increasingly common practice to record image information on magnetic discs or other large area memory devices. Maintaining close contact over the relatively large areas associated with such magnetic devices poses problems similar to those encountered in the optical contact printing of large area imagery, discussed above.

SUMMARY OF THE INVENTION

In accordance with the present invention, a method is provided for obtaining close contact between a master device and a replicate device, even over relatively large areas, without applying mechanical pressure or using a vacuum pump to evacuate air from between the master and replicate devices. According to a presently preferred embodiment, a master device and a replicate device are superposed with a liquid therebetween to form a master-replicate combination. The master-replicate combination is then spun causing the liquid to form a thin layer between the master and replicate devices. A vacuum effect results which maintains the master and replicate devices in close contact.

BRIEF DESCRIPTION OF THE DRAWINGS

In the detailed description of the preferred embodiments of the invention presented below, reference is made to the accomanying drawings in which.

DESCRIPTION OF THE PREFERRED EMBODIMENTS

As seen from the discussion above, maintaining close contact between the master and replicate devices is important for high quality contact printing, whether it be optical, magnetic, or some other form. In the case of optical contact printing, contact losses of only 1 micron can have a substantial effect upon the modulation transfer function at high frequencies, i.e., 200 line pairs/mm (l/mm) and up. In accordance with a method provided by the present invention, close contact is obtained between a master device and a replicate device such that frequencies in excess of 500 l/mm can be successfully contact printed even over relatively large areas.

Figure 1:
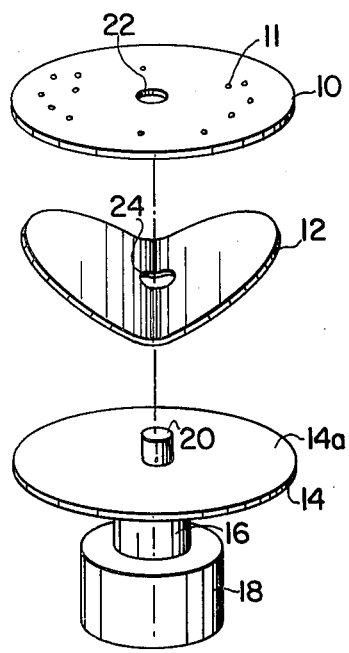
FIG. 1 is a perspective view of certain elements used to illustrate the present invention.

For sake of clarity, certain elements used to illustrate a presently preferred embodiment of the invention are shown in FIG. 1. A master device in the form of a twelve inch master disc 10 carries imagery in the form of transparent areas 11 which are to be replicated onto a replicate device in the form of a disc 12. In this embodiment, it is assumed that both the master and replicate discs 10, 12 are flexible, e.g. having a substrate comprised of ESTAR (polyethylene terephthalate) or other flexible material. A support disc 14 is mounted on a shaft 16 which is rotatable by a motor 18. The support disc 14 is rigid and has the upper surface 14a polished to a high degree of flatness. A suitable material for the support disc 14 is a glass disc having one surface made optically flat. A registration pin 20 protrudes from the top of the support disc 14, and both the master and replicate discs 10, 12 have holes 22, 24 respectively which are sized to accept the registration pin 20. As will be seen from the discussion below, the present invention provides a method for maintaining the master disc 10 and the replicate disc 12 in close contact so as to ensure high quality image transference.

Figure 2A:
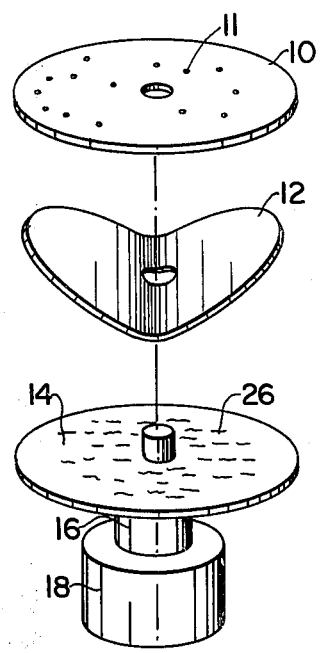
FIGS. 2a, 2b, 3 and 4 illustrate a method in accordance with one embodiment of the present invention for obtaining close contact between a master device and a replicate device.
Figure 2B:
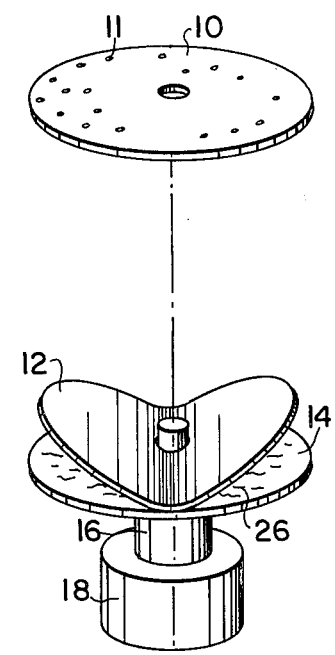

Referring to FIGS. 2a and 2b, the first step is to apply a liquid 26 to the surface of the support disc 14. In this example, the liquid 26 is Fluorinert (by 3M Company), although numerous other types of liquids are suitable, as discussed more fully below. The replicate disc 12 is supported (by hand, for example) at diametrically opposed edge points. Because the replicate disc 12 is flexible, the center portion sags below the supported edges. The replicate disc 12 is then lowered into contact with the support disc 14, the registration pin 20 fitting through the hole 24 to properly align the replicate disc 12 with the support disc 14. As shown in FIG. 2b, the replicate disc 12 first contacts the fluid 26 along a diameter roughly perpendicular to that on which the support points lie. As the support points are lowered further, the liquid 26 which is sandwiched between the replicate and support discs 12, 14 produces a vacuum effect which holds the discs 12, 14 together. The above method of forming a replicate-support device combination is advantageous because few, if any, bubbles are trapped in the liquid 26 between the replicate and support disc 12, 14. It will be apparent from the above discussion that the liquid 26 could have been applied to the replicate disc 12 rather than the support disc 14, or even to both discs 12, 14.

Figure 3:
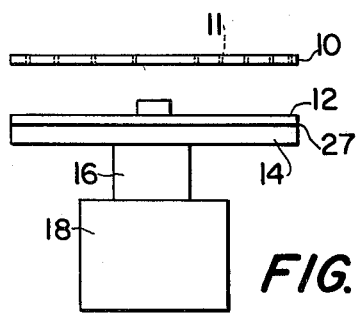

The replicate-support device combination is now spun about an axis substantially perpendicular to the surface of the support disc 14 at a rate of about 1,000 to 2,000 rpm for aproximately one minute. The centrifugal force acting on the liquid 26 causes most of the liquid to fly out from around the edge of the replicate-support device combination. Only a very thin liquid layer 27 (see FIG. 3) remains sandwiched between the replicate and support discs 12, 14. A vacuum action is thus produced which causes the replicate and support discs 12, 14 to be tightly pressed together, or adhered, thereby achieving close contact over the entire disc surfaces. The rate at which the replicate-support device combination is spun and the duration of spinning determines the final thickness and uniformity of the liquid layer 26 for a given liquid. It has been found that the above spin parameters result in an extremely thin and highly uniform liquid layer of Fluorinert, believed to have a thickness of about 100Å. Since the support disc 14 is polished to a high degree of flatness and the layer of liquid 27 is highly uniform, the flexible replicate disc 27 assumes a highly planar configuration having a flatness approaching that of the support disc 14.

Figure 4:
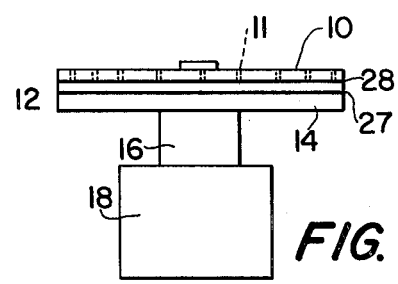

The master disc 10 is now adhered to the replicate disc 12 by the same process to produce the combination shown in FIG. 4. The master disc 10 is in close contact with the replicate disc 12 due to the vacuum action produced by a layer of liquid 28. Like the layer 27, the liquid layer 28 is very thin and highly uniform. Thus, the master disc 10 assumes a highly planar configuration having a flatness approaching that of the replicate disc 12.

Figure 5:
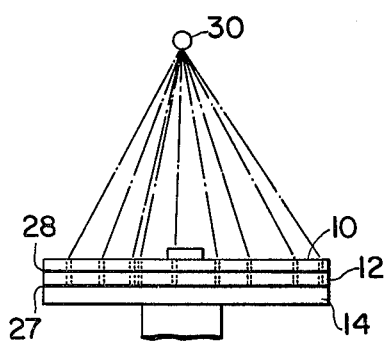
FIG. 5 illustrates the exposure step of a contact printing process.
Figure 6:
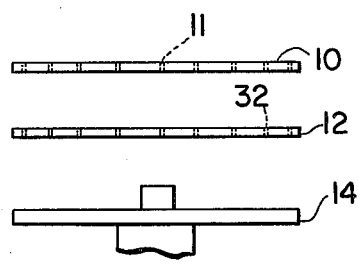
FIG. 6 shows a result of practicing the invention.

The master disc 10 and the replicate disc 12 are now in close and uniform contact over the entire disc 10, 12 surfaces and are ready for contact printing. To facilitate handling of the master-replicate disc 10, 12 combination, the support disc 14 remains adhered to the combination and the three discs are removed from the shaft 16 as a unit. The master-replicate disc 10, 12 combination can then be easily handled by means of the support disc 14 without adversely affecting the close contact between the tightly adhered master disc 10 and replicate disc 12. As shown in FIG. 5, the replicate disc 12 is exposed to actinic radiation from a light source 30. After exposure, the three discs are separated by peeling them apart as shown in FIG. 6. The exposed images 32 in the replicate disc 12 are latent images which, upon development by conventional means, become the replicated imagery from the master disc 10.

It is thus seen that close contact between a master disc and a replicate disc can be obtained by applying liquid to the replicate disc, placing the master disc in contact with the replicate disc, and then spinning the disc combination. Liquid is forced from between the discs under the influence of centrifugal force leaving a very thin, highly uniform layer of liquid between the master and replicate discs.

For optimum results, the liquid should have certain properties. First, it should be clean and generally free of particle contaminants. Due to the extremely thin layer of liquid remaining between the discs, any particles which contaminate the liquid will give rise to an abrupt spacing change between the discs, thereby adversely affecting the contact printing process in the immediate vicinity thereof. It will be apparent that the number and size of particle contaminants which can be tolerated depend upon the type of imagery which it is desired to contact print. For example, fine detail or high frequency imagery such as small dots or fine lines will permit fewer and smaller sized particle contaminants than lower frequency imagery with few sharp edges. It is also desirable that the liquid have an index of refraction which is greater than or equal to that of the master disc support, thereby reducing the effects of diffraction.

Another desirable property of the liquid is that it wet the surface of the master disc and replicate disc with which it comes in contact. By "wetting" the surface it is meant that the liquid uniformly covers the surface and does not bead or leave open areas of the surface exposed. In addition to wetting the surface, the liquid should preferably be inert with respect to the surface with which it comes in contact. Otherwise, the master disc or replicate disc may be damaged.

It is also convenient to use a liquid which has a low vapor pressure so it will now evaporate before the contact printing process is completed. For those applications, however, where the contact printing process occurs soon after adherence of the master disc to the replicate disc, the vapor pressure is not critical. Also, since evaporation of the liquid first occurs at the edges of the sandwiched discs, the vapor pressure of the liquid is not as important if the imagery to be replicated is confined to the inner regions of the master disc.

While the above discussion regarding the properties of liquids useful in the practice of the invention is sufficient to enable one skilled in the art to select a liquid or liquids suitable for a particular application, it is convenient to consider some specific examples of liquids which have been found to give good results, at least for some applications: Fluorinert (inert, low viscosity, low vapor pressure, manufactured by 3M Company); Arclor 1254 (index of refraction matches ESTAR, manufactured by Monsanto Chemical Co.); 1,1,2,2-tetraboromoethane (index of refraction matches ESTAR); Series A index of refraction liquid 1.64 (index of refraction matches ESTAR, manufactured by R. P. Cargille Labs, Inc.); Benzene (inert to Bi); Toluene (inert to Bi); Xylene (inert to Bi); Chlorobenzene (inert to Bi); and water with a surfactant added (inert to thermoplastic recording materials).

The thickness of the liquid layer between the master disc and the replicate disc can be controlled somewhat by properly selecting the viscosity of the liquid, spin speed and duration of spin. The thickest coatings are obtained for a high viscosity liquid, a relatively slow spin speed and short spin duration. The spin speed and duration cannot, however, be made arbitrarily low because the uniformity of the remaining liquid layer may be affected.

Under certain circumstances, it may be desirable to use special materials to make the liquid chemically active with the replicate device. For example, the bleaching agent of a dye-bleach system could be applied in the liquid to overcome coating instability of fast systems. Developer could be added to provide instant print-out. Activators, fixers, or sensitizers could also be applied at this stage if so desired, depending on the system.

There are many modifications which can be made to the above-described embodiment. For example, the rigid support disc 14 was assumed to have an optically flat surface. The flatness of the support disc 14 appears to affect the uniformity of the liquid layer 27 between the support disc 14 and the replicate disc 12, thus also affecting the uniformity of the liquid layer 28 between the replicate disc 12 and the master disc 10. The result of using a "bumpy" support disc 14 would be an uneven spacing between the master disc 10 and the replicate disc 12. For some applications, i.e., where only low spatial frequency imagery is of interest, spacing variations are relatively unimportant and can be tolerated to some extent. For applications wherein it is desired to contact print micron or sub-micron sized dots, or pictorial imagery containing high spatial frequency information, the master-disc spacing is critical and any variation will adversely affect the contact printing operation. Thus, the surface quality of the support disc 14 should be chosen according to the application.

Figure 7:
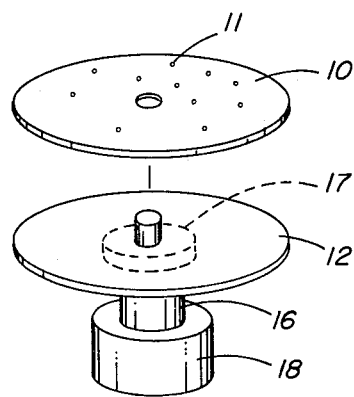
FIG. 7 illustrates an alternate method in accordance with the present invention of obtaining close contact between a master device and a replicate device.

It may be that the replicate disc 12, rather than being flexible, is itself rigid. In this case, the replicate disc 12 may be used as the support disc 14, thereby obviating the need for a separate support disc 14, see FIG. 7. It is then only necessary to provide a suitable mounting chuck 17 to connect the replicate disc 12 to the rotatable shaft 16. Likewise, a rigid master disc can be used with a flexible replicate disc without the need of a rigid support device.

Figure 8A:
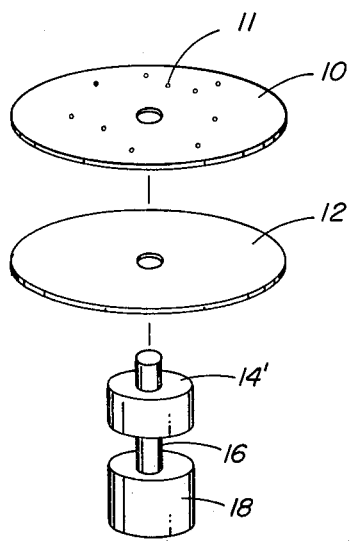
FIGS. 8a and 8b show alternate forms of apparatus useful in connection with the present invention.
Figure 8B:
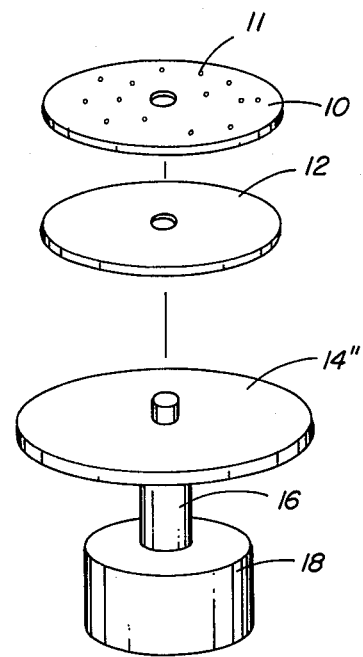

FIGS. 8a and 8b show alternate forms of the support disc 14. In FIG. 8a the support disc 14' is smaller than the replicate disc 12 and in FIG. 8b it is larger. Either type of support disc 14 will perform satisfactorily, at least for some applications.

The invention has been described in detail with particular reference to preferred embodiments thereof, but it will be understood that variations and modifications can be effected within the spirit and scope of the invention. For example, while the particular master and replicate devices discussed above were all disc-shaped, the present invention may be used to contact print imagery from and onto various irregular shapes as well. For example, the master device and/or the replicate device could be rectangularly shaped rather than disc-shaped and they may even be of different sizes as long as the replicate device is large enough to accept the image area of interest.

What is claimed is:

1. A method of obtaining close contact between a master device and a replicate device, said method comprising the steps of:
    forming a master-replicate combination by superposing the master and replicate devices with a liquid therebetween; and
    spinning the master-replicate combination to obtain a layer of liquid between substantially the entire adjacent surfaces of the master and replicate devices, said liquid layer having a thickness less than about 1 micron.

2. A method of obtaining close contact between a master device having information recorded thereon and a replicate device for receiving the recorded information, said method comprising the steps of:
    forming a master-replicate combination by superposing the master and replicate devices in registration, the superposed master and replicate devices having a liquid in between; and
    spinning the master-replicate combination until a thin layer of liquid is formed having a thickness of about 100 angstroms substantially filling the space between the master and replicate devices.

3. A method of obtaining close contact between a master device and a replicate device in order to replicate imagery from the master device to the replicate device, said method comprising the steps of:
    superposing the master and replicate devices according to a desired registration to form a master-replicate combination having a liquid between the master and replicate devices; and
    spinning the master-replicate combination to cause the liquid to form a uniform layer between substantially the entire adjacent surfaces of the master and replicate devices, said liquid layer having a thickness less than about 1 micron, thus producing a vacuum effect which holds the master and replicate devices in close contact.

4. A method of obtaining close contact between a master device having imagery thereon and a replicate device for receiving the imagery, said method comprising the steps of:
applying a liquid to one or both of said master or replicate devices;
superposing the master and replicate devices to form a master-replicate combination having liquid between the master and replicate devices; and
spinning the master-replicate combination to cause the liquid to form a uniform layer about 100 angstroms in thickness between substantially the entire adjacent surfaces of the master and replicate devices.

5. A method of obtaining close contact between a master device and a replicate device in order to replicate imagery from the master device to the replicate device, said method comprising the steps of:
applying a liquid to one or both of the master or replicate devices;
superposing, according to a desired registration, the master and replicate devices to form a master-replicate combination with liquid between the master and replicate devices; and
spinning the master-replicate combination so as to leave a layer of liquid less than about 1 micron in thickness substantially filling the space between the master and replicate devices, thereby producing a vacuum effect holding the master device and the replicate device in close contact.

6. A method of obtaining close contact between a master device having imagery thereon and a replicate device for receiving the imagery, the master and replicate devices each having a generally planar surface, said method comprising the steps of:
forming a master-replicate combination by superposing the generally planar surfaces of the master and replicate devices with a liquid therebetween; and
spinning the master-replicate combination to form a uniform layer of liquid less than about 1 micron in thickness between substantially the entire adjacent and generally planar surfaces of the master and replicate devices.

7. A method of obtaining close contact between a master device and a replicate device in order to replicate imagery from the master device to the replicate device, the master and replicate devices each having a generally planar surface, said method comprising the steps of:
applying a liquid to the generally planar surface of one of said master or replicate devices;
placing the generally planar surface of the other of said master or replicate devices in contact with the liquid to form a master-replicate combination; and
spinning the master-replicate combination to form a thin and uniform layer of liquid less than about 1 micron in thickness substantially filling the space between the generally planar surfaces of the master and replicate devices, thereby producing a vacuum effect which holds the generally planar surfaces of the master and replicate devices in close contact.

8. A method of obtaining close contact between a master device having imagery thereon and a replicate device for receiving the imagery, one of the master or replicate devices being flexible, and the other of the master or replicate devices being rigid and having a generally planar surface, said method comprising the steps of:
forming a master-replicate combination by superposing the flexible of the master or replicate devices with the generally planar surface of the rigid of the master or replicate devices with a liquid therebetween; and
spinning the master-replicate combination to leave a thin and uniform layer of liquid less than about 100 angstroms in thickness substantially filling the space between the master and replicate devices.

9. A method of obtaining close contact between a master device and a replicate device, one of the master or replicate devices being flexible and the other of the master or replicate devices being rigid and having a generally planar surface, said method comprising the steps of:
applying a liquid to one of said master or replicate devices;
placing the other of the master or replicate devices in contact with the liquid to form a master-replicate combination having liquid between the flexible of the master or replicate devices and the generally planar surface of the rigid of the master or replicate devices; and
spinning the master-replicate combination to form a thin and uniform layer of liquid less than about 1 micron in thickness substantially filling the space between the master and replicate devices, thereby producing a vacuum effect which holds the master and replicate devices in close contact.

10. A method of obtaining close contact between a master device having imagery thereon and a replicate device for receiving the imagery, both the master and replicate devices being flexible, and said method for use with a support device having a generally planar surface, said method comprising the steps of:
forming a support device combination by superposing one of the master or replicate devices with the generally planar surface of the support device with a liquid therebetween;
spinning the support device combination to leave a thin and uniform layer of liquid substantially filling the space between the one of the master or replicate devices and the generally planar surface of the support device;
forming a master-replicate-support device combination by superposing, with a liquid therebetween, the other of the master or replicate devices with the one of the master or replicate devices forming part of the support device combination; and
spinning the master-replicate-support device combination to leave a thin and uniform layer of liquid substantially filling the space between the last superposed of the master or replicate devices and the support device combination.

11. A method of contact printing imagery from a master device to a replicate device, said method comprising the steps of:
forming a master-replicate combination by superposing the master and replicate devices in registration, the superposed master and replicate devices having a liquid in between;
spinning the master-replicate combination until a thin layer of liquid less than about 1 micron in thickness is formed substantially filling the space between the master and replicate devices; and exposing the replicate device of the master-replicate combination to actinic radiation through the master device.

12. A method of contact printing imagery from a master device to a replicate device comprising the steps of:
   applying a liquid to one of said master or replicate devices;
   superposing the master and replicate devices to form a master-replicate combination having liquid between the master and replicate devices;
   spinning the master-replicate combination to cause the liquid to form a thin and uniform layer less than about 1 micron in thickness substantially filling the space between the master and replicate devices; and
   exposing the replicate device of the master-replicate combination to actinic radiation through the master device.

13. A method of contact printing imagery from a master device to a replicate device comprising the steps of:
   applying a liquid to one of the master or replicate devices;
   placing, according to a desired registration, the other of said master or replicate devices in contact with the liquid to form a master-replicate combination with liquid between the master and replicate devices;
   spinning the master-replicate combination so as to leave a thin layer of liquid less than about 1 micron in thickness substantially filling the space between the master and replicate devices, thereby producing a vacuum effect holding the master device and the replicate device in close contact; and
   exposing the replicate device of the master-replicate combination to actinic radiation through the master device.

14. A method of contact printing imagery from a master device to a replicate device, one of the master or replicate devices being flexible, and the other of the master or replicate devices being rigid and having a generally planar surface, said method comprising the steps of:
   forming a master-replicate combination by superposing the flexible of the master or replicate devices with the generally planar surface of the rigid of the master or replicate devices with a liquid therebetween;
   spinning the master-replicate combination to leave a thin and uniform layer of liquid less than about 1 micron in thickness substantially filling the space between the master and replicate devices; and
   exposing the replicate device of the master-replicate combination to actinic radiation through the master device.

15. A method of contact printing information from a flexible master device to a flexible replicate device, said method for use with a support device having a generally planar surface, said method comprising the steps of:
   forming a support device combination by superposing one of the master of replicate devices with the generally planar surface of the support device with a liquid therebetween;
   spinning the master-replicate support device combination to leave a thin and uniform layer of liquid less than about 1 micron in thickness substantially filling the space between the last superposed of the master or replicate devices and the support device combination; and
   exposing the replicate device of the master replicate combination to actinic radiation through the master device.

16. A method of obtaining close contact between a master device having imagery thereon and a replicate device, said method comprising the steps of:
   forming a master-replicate combination by superposing the master and replicate devices with a liquid therebetween, the liquid being chemically active with the replicate device; and
   spinning the master-replicate combination to obtain a thin layer of liquid less than about 1 micron in thickness substantially filling the space between the master and replicate devices.

17. A method of obtaining close contact between a master device and a replicate device in order to replicate imagery from the master device to the replicate device, said method comprising the steps of:
   applying a liquid to one of the master or replicate devices, which liquid is chemically active with the replicate device;
   placing, according to a desired registration, the other of said master or replicate devices in contact with the liquid to form a master-replicate combination with liquid between the master and replicate devices; and
   spinning the master-replicate combination so as to leave a thin layer of liquid less than about 1 micron in thickness substantially filling the space between the master and replicate devices, thereby producing a vacuum effect holding the master device and the replicate device in close contact.

18. A method of contact printing imagergy from a master device to a replicate device, said method comprising the steps of:
   forming a master-replicate combination by superposing the master and replicate devices in registration, the superposed master and replicate devices having a liquid in between, the liquid being chemically active with the replicate device;
   spinning the master-replicate combination until a thin layer of liquid is formed having a thickness less than about 1 micron substantially filling the space between the master and replicate devices; and
   exposing the replicate device of the master-replicate combination to actinic radiation through the master device.

* * * * *